United States Patent
Schlenga et al.

(10) Patent No.: US 11,653,575 B2
(45) Date of Patent: May 16, 2023

(54) SUBELEMENT BASED ON NB-CONTAINING ROD ELEMENTS WITH POWDER-FILLED CORE TUBE FOR AN NB₃SN-CONTAINING SUPERCONDUCTOR WIRE, AND ASSOCIATED PRODUCTION METHOD

(71) Applicant: Bruker EAS GmbH, Hanau (DE)

(72) Inventors: Klaus Schlenga, Karlsruhe (DE); Matheus Wanior, Gelnhausen (DE); Vital Abaecherli, Erlensee (DE); Manfred Thoener, Biebergemuend (DE); Carl Buehler, Langenselbold (DE); Bernd Sailer, Alzenau (DE)

(73) Assignee: BRUKER EAS GMBH, Hanau (DE)

( * ) Notice: Subject to any disclaimer, the term of this patent is extended or adjusted under 35 U.S.C. 154(b) by 0 days.

(21) Appl. No.: 17/559,394

(22) Filed: Dec. 22, 2021

(65) Prior Publication Data
US 2022/0115578 A1   Apr. 14, 2022

Related U.S. Application Data

(63) Continuation of application No. PCT/EP2020/067236, filed on Jun. 19, 2020.

(30) Foreign Application Priority Data

Jun. 25, 2019   (DE) .................. 10 2019 209 170.9

(51) Int. Cl.
H01L 33/64   (2010.01)
(52) U.S. Cl.
CPC ..... H10N 60/0184 (2023.02); H10N 60/0128 (2023.02)
(58) Field of Classification Search
CPC ................ H01L 39/2409; H01L 39/2403
See application file for complete search history.

(56) References Cited

U.S. PATENT DOCUMENTS 5,534,219 A   7/1996   Marancik et al.
7,585,377 B2   9/2009   Field et al.
(Continued)

FOREIGN PATENT DOCUMENTS

CN   105913967 A   8/2016
EP   2717340 A2   4/2014
(Continued)

OTHER PUBLICATIONS

Xu et al., "Internally Oxidized Nb3Sn Strands with Fine Grain Size and High Critical Current Density", Advanced Materials, Jan. 2015, pp. 1346-1350.

Primary Examiner — Paul A Wartalowicz
(74) Attorney, Agent, or Firm — Edell, Shapiro & Finnan, LLC

(57) ABSTRACT

A subelement (1) for an Nb₃Sn-containing superconductor wire includes
an Sn-containing core (2),
an inner matrix (5) which includes Cu and surrounds the Sn-containing core (2),
a region (7) of mutually abutting Nb-containing rod elements (8, 30), which surrounds the inner matrix (5), where the Nb-containing rod elements (8, 30) are each configured with an Nb-containing core filament (9; 31) and a Cu-containing filament casing (10),
an outer matrix (6) which includes Cu and surrounds the region (7) of Nb-containing rod elements (8, 30). The Sn-containing core (2) has a core tube (3) into which an Sn-containing powder (4) has been introduced, the Sn-containing powder (4) being in a compacted state. This provides a subelement for an Nb₃Sn-containing superconductor wire which cost-effectively yields an improved superconducting current carrying capacity.

22 Claims, 6 Drawing Sheets

(56) References Cited

U.S. PATENT DOCUMENTS

| | | |
|---|---|---|
| 9,330,819 B2 | 5/2016 | Schlenga |
| 9,741,471 B2 | 8/2017 | Thoener et al. |
| 2006/0204779 A1* | 9/2006 | Miyatake ............ H01L 39/2409 |
| | | 428/646 |
| 2008/0027490 A1 | 1/2008 | Sheldon et al. |
| 2008/0274903 A1 | 11/2008 | Field et al. |
| 2010/0255998 A1 | 10/2010 | Buta |
| 2014/0096997 A1 | 4/2014 | Schlenga et al. |
| 2014/0287929 A1 | 9/2014 | Thoener |
| 2016/0247606 A1 | 8/2016 | Thoener et al. |
| 2017/0062099 A1 | 3/2017 | Xu et al. |
| 2018/0158577 A1 | 6/2018 | Xu et al. |
| 2018/0315523 A1 | 11/2018 | Smathers et al. |
| 2020/0020463 A1 | 1/2020 | Banno et al. |
| 2020/0108447 A1 | 4/2020 | Thoener |

FOREIGN PATENT DOCUMENTS

| | | |
|---|---|---|
| EP | 2779258 B1 | 9/2015 |
| EP | 3062359 B1 | 8/2017 |
| JP | 2004171829 A | 6/2004 |
| WO | 2015175064 A2 | 11/2015 |
| WO | 2018198515 A1 | 11/2018 |

\* cited by examiner

SUBELEMENT BASED ON NB-CONTAINING ROD ELEMENTS WITH POWDER-FILLED CORE TUBE FOR AN NB₃SN-CONTAINING SUPERCONDUCTOR WIRE, AND ASSOCIATED PRODUCTION METHOD

CROSS REFERENCE TO RELATED APPLICATIONS

This is a Continuation of International Application PCT/EP2020/067236, which has an international filing date of Jun. 19, 2020, and the disclosure of which is incorporated in its entirety into the present Continuation by reference. In addition, the present Continuation claims the benefit of and priority to German patent application 10 2019 209 170.9, filed Jun. 25, 2019. The entire content and disclosure of this German patent application is also incorporated by reference into the present Continuation.

FIELD OF THE INVENTION

The invention relates to a subelement for an $Nb_3Sn$-containing superconductor wire, where the subelement is configured with
- an Sn-containing core,
- an inner matrix which comprises Cu and which surrounds the Sn-containing core,
- a region of mutually abutting Nb-containing rod elements, which surrounds the inner matrix, where the Nb-containing rod elements are each configured with an Nb-containing core filament and a Cu-containing filament casing, more particularly where the Nb-containing rod elements are each configured hexagonally in external cross section,
- an outer matrix which comprises Cu and surrounds the region of Nb-containing rod elements.

One such subelement has been disclosed in EP 2 717 340 A2.

BACKGROUND

Superconductor materials are able to carry electrical current with virtually no ohmic losses, and are used, for example, to construct magnetic coils with which particularly high magnetic field strengths can be generated.

One important superconductor material, particularly for the construction of magnetic coils, is $Nb_3Sn$. Since $Nb_3Sn$ is not amenable to plastic deformation, the production of an $Nb_3Sn$-containing superconductor wire (also herein, simply: $Nb_3Sn$ superconductor wire) usually involves first the fabrication of a preliminary conductor (also called subelement) which comprises Nb and Sn, typically with Cu as matrix material. The preliminary conductor is processed to a fully fabricated conductor by reshaping with a tapering in cross section, and by the bundling of a plurality of the subelements. This fabricated conductor is usually subjected again to reshaping with a tapering in cross section, and then brought into a desired geometry, by the winding of a coil, for instance. Subsequently, in a reactive heat treatment, the superconducting $Nb_3Sn$ phase is generated, so turning the fabricated conductor into the completed $Nb_3Sn$ superconductor wire. The production of an $Nb_3Sn$ superconductor wire is therefore a multistage operation which is difficult overall. Here, a number of routes have developed, which have considerable differences in their approach and in the reactions that take place and that are relevant to the quality of the completed $Nb_3Sn$ superconductor wire.

In the case of what is called the bronze route, the Sn which is to react with the Nb of the preliminary conductor is provided in the preliminary conductor by way of a bronze matrix. The bronze route is comparatively simple to perform, but the Sn content of the bronze matrix limits the formation of the $Nb_3Sn$ phase.

In the case of the internal tin route, a source of tin is disposed in the preliminary conductor, usually centrally, and in the reactive heat treatment the Sn from the core is reacted with the Nb of the preliminary conductor usually through a Cu matrix. In the case of a procedure according to the powder-in-tube principle (abbreviated to PIT), Sn-containing powder is arranged in a tube made of Nb or an Nb alloy. The filled Nb tube is arranged in a Cu-containing sheath, to obtain a PIT element. The PIT elements are drawn and bundled. In the reactive heat treatment, the Sn in the PIT core reacts directly with the ensheathing Nb tube. A typical PIT process is described, for example, by EP 3 062 359 B1. The PIT process, while more complex than the bronze route, achieves better current carrying capacities.

One variant of a PIT process is described by EP 2 779 258 B1, where, rather than the one Nb tube, an outer tube of Nb or an Nb alloy and also an inner tube of Nb or Nb alloy are used. The inner tube is filled separately with an Sn- and Cu-containing powder and drawn, with the powder contained being compacted. Thereafter the drawn inner tube is inserted into the outer tube.

The internal tin route may also take place in accordance with the restack rod process principle (abbreviated to RRP and involving rebundling of the rods). In this case a multiplicity of hexagonal Nb filaments (also called Nb-containing rod elements), typically each comprising an Nb rod and a surrounding Cu filament casing, are annularly bundled and surrounded inside and outside by a Cu matrix. Arranged in the interior is a center comprising Sn, and on the outside a diffusion barrier and a Cu casing are arranged. Subelements configured in this way are drawn to a hexagonal external cross section, bundled, and surrounded—for the formation of a wire—by a copper matrix; cf. U.S. Pat. No. 7,585,377 B2. With the RRP process it is possible to achieve very high superconducting current carrying capacities in a completed $Nb_3Sn$ superconductor wire.

EP 2 717 340 A2 describes a semifinished product for an Nb3Sn superconductor wire for an RRP process, which uses, for the Nb-containing rod elements, Cu-containing filament casings which additionally are also Sn-containing. In one variant the proposal is to form the Sn-containing structure, which is disposed centrally in the inner Cu matrix, by a powder of elemental Sn which is contained in a drilled hole in the inner Cu-containing matrix.

A more specific variant of a fabricated conductor for an $Nb_3Sn$ superconductor wire encompasses the bundling of NbCu rods and Cu rods with NaCl filling in a Cu jacket. The NaCl is flushed out with water and replaced by Sn; cf. U.S. Pat. No. 5,534,219 A.

WO 2015/175064 A2 describes $Nb_3Sn$ superconductor wires and associated production methods, where metal oxide precipitates are formed during the reactive heat treatment. Similar $Nb_3Sn$ superconductor wires are described by X. Xu et al. in "Internally Oxidized $Nb_3Sn$ Strands with Fine Grain Size and High Critical Current Density", Adv. Mater. 2015, 27, pages 1346-1350.

SUMMARY

It is an object of the invention to provide a subelement for an $Nb_3Sn$-containing super conductor wire with which it is possible, in a simple and cost-effective way, to achieve an improved superconducting current carrying capacity.

Description of the Invention

According to one formulation, this object is achieved by a subelement of the type stated at the outset, which is characterized
in that the Sn-containing core comprises a core tube into which an Sn-containing powder has been introduced, wherein the Sn-containing powder is in a compacted state.

The invention includes equipping a subelement for an RRP process with an Sn-containing core which is based on a compacted Sn-containing powder. Through the use of an Sn-containing powder it is possible to adjust the composition of the Sn-containing core, more particularly the distribution of the elemental fractions of Sn and other elements, particularly metals such as Cu, in a simple way and to adapt it to a desired application. There is, in particular, no need to produce expensive Sn-containing core rods with different compositions for different applications. It is possible in this way to optimize the formation of the superconducting phase ($Nb_3Sn$) in a reactive heat treatment (also called reactive annealing), and hence to optimize the current carrying capacity of the completed superconductor wire, in a simple and cost-effective way. By adjusting the composition of the Sn-containing core and/or the Sn-containing powder, the current carrying capacity (critical current density) of the important fine-grained $Nb_3Sn$ fraction in the completed superconductor wire can be increased.

By compacting the Sn-containing powder, as encompassed by the invention, it is possible not only to obtain a particularly high fraction of superconducting phase in the cross section of the superconducting wire, but also to improve the diffusion of Sn from the Sn-containing core into the region of the Nb-containing rod elements and to improve overall the efficiency of the formation of $Nb_3Sn$. In particular, the proportion of Sn in the fine-grained $Nb_3Sn$ fraction and also the proportion of the fine-grain fraction itself can be increased further, thus boosting overall the current carrying capacity (critical current density integrated over the wire cross section) of the completed superconductor wire, and at the same time, as a result of the easily adjustable composition, it is also possible to maintain the critical current density of this fraction at a high level.

In the case of superconductor wires based on conventional PIT subelements, the proportion of the important fine-grained $Nb_3Sn$ fraction is usually lower in comparison to RRP-based superconductor wires. In the context of the invention, at least a predominant part of the Nb for forming the $Nb_3Sn$ phase is contributed by the Nb-containing rod elements. An expensive Nb tube as a principal source of Nb, as is needed in the PIT process, is not required. In the region of the Nb-containing rod elements as Nb source, the diffusion of Sn is made easier in comparison to an Nb tube as Nb source, since the Cu-containing filament casings provide a network of rapid diffusion paths. By way of these paths, even regions of the subelement that are radially further out can be readily reached by the Sn from the compacted powder core. As a result, the proportion (volume proportion) of fine-grained $Nb_3Sn$ fraction in the completed superconductor wire can be increased, which improves the superconducting current carrying capacity (critical current integrated over the wire cross section) of the completed superconducting wire.

At the same time, by using the compacted Sn-containing powder as Sn source, the superconductive current carrying capacity (critical current density) of the fine-grained $Nb_3Sn$ fraction and the proportion thereof in the completed microstructure can also be increased, and so the combination of measures in accordance with the invention achieves an overall improvement in the current carrying capacity of the completed superconductor wire, this improvement going far beyond the anticipated effects of the individual measures.

Particularly good current carrying capacities can be achieved if in the subelement the wall thickness WS of the core tube is small in relation to the diameter D of the core tube, for instance with WS≤0.15*D, preferably WS≤0.10*D, and/or if the largest radial distance GA between the core tube and the inside of the region of the Nb-containing rod elements of the inner matrix is small in relation to the diameter D of the core tube, for instance with GA≤0.30*D, preferably GA≤0.20*D, more preferably GA≤0.10*D, and/or if the distance FA (smallest distance from outside to outside) between the Nb-containing core filaments is small in relation to the diameter FD of the Nb-containing core filaments, for instance with FA≤0.30*FD, preferably FA≤0.20*FD, more preferably FA≤0.15*FD, very preferably FA≤0.10*FD (in this regard, cf. also FIG. 1 below). All three measures, each on their own and preferably in combination, contribute to improving and to homogenize the diffusion of Sn from the Sn-containing core, more particularly from the compacted Sn-containing powder, into the Nb-containing core filaments, and this in turn enables an even greater proportion of fine-grained $Nb_3Sn$ fraction with further-improved current carrying capacity.

The compacted Sn-containing powder in the core tube typically has at least 25%, preferably at least 40%, and more preferably at least 50% of the theoretical density. The Sn content (independently of the chemical form of the Sn, more particularly including elemental Sn, Sn present in alloy form, and Sn bound in intermetallic phases) of the Sn-containing powder is typically at least 40 wt %, preferably at least 50 wt %, and more preferably at least 60 wt %.

Preferred Embodiments

In one preferred embodiment of the subelement of the invention, the Sn-containing powder in the Sn-containing core has a pressed microstructure which is obtainable by reshaping of the filled core tube with a reduction in cross section. In other words, the Sn-containing powder is compressed substantially in radial direction, in particular by prior drawing, rolling, pressing or extruding of the core tube filled with the Sn-containing powder. The pressed microstructure may be determined, for example, by the orientation of the powder grains and their state of stress, for instance in a polished section and/or by X-ray diffraction measurement. The reshaping with reduction in cross section enables a compaction of the Sn-containing powder in a simple way. This compaction, moreover, is very uniform by comparison with axial pressing techniques, and can also be carried out readily over relatively large axial lengths.

Also preferred is an embodiment wherein the Sn-containing powder is a powder mixture which comprises Sn in at least two different chemical forms, more particularly where the Sn-containing powder comprises Sn in at least two of the following chemical forms:
  elemental Sn,
  one or more differently composed intermetallic phases or alloys of Nb and Sn, preferably $NbSn_2$ and/or $Nb_6Sn_5$,
  one or more differently composed intermetallic phases or alloys of Cu and Sn,
  one or more differently composed intermetallic phases or alloys of Sn and Ti,
  one or more differently composed intermetallic phases or alloys of Sn and Ta. This simplifies the adjustment of the proportion of Sn in the Sn-containing powder, with simultaneous adjustment of the proportions of other elements. Elements in the Sn-containing core that are present additionally to Sn can contribute in particular to improving the reshaping properties, to improving the diffusion behavior or else to improving the current carrying capacity (through formation, for instance, of ternary phases or pinning centers, or generally by adjustment of the microstructure).

Advantage is achieved by an embodiment wherein the Sn-containing powder is a powder mixture which comprises a Cu-containing powder fraction,
more particularly where the Cu-containing powder fraction comprises elemental Cu. By resorting to a proportion of Cu, it becomes possible to improve the reshaping properties of the subelement and/or the core, particularly if there is elemental Cu in the powder. With Cu it also becomes possible to achieve accelerated diffusion of the Sn to the Nb-containing rod elements during the reactive heat treatment.

In one preferred embodiment, the core tube is Cu-containing, more particularly with at least 25 wt % of Cu, preferably with at least 50 wt % of Cu. The Cu-containing core tube has good reshape properties for reshaping with a reduction in cross section. Moreover, the Cu present can contribute to improving the diffusion of Sn from the core to the Nb-containing rod elements.

Particularly preferred is an embodiment wherein the core tube is Nb-containing, more particularly with at least 50 wt % of Nb, preferably with at least 75 wt % of Nb. Through an Nb-containing core tube it is possible, during the reactive heat treatment on the core tube, first to form an Nb-containing phase with a high proportion of Sn, more particularly NbSn2. Incidentally, the further-outward diffusion of Sn is initially blocked. At a higher temperature, the Nb-containing phase with a high proportion of Sn then breaks down into Sn and $Nb_3Sn$, hence providing a source of Sn at a late point in time of the reactive heat treatment, relatively near to the Nb-containing rod elements. This allows a particularly fine and uniform $Nb_3Sn$ microstructure to be achieved (high proportion of the fine-grained $Nb_3Sn$ fraction), which increases the superconducting current carrying capacity. Moreover, the areal fraction of the subelement in which $Nb_3Sn$ is formed can be increased. Both factors contribute to a high superconducting current carrying capacity. The core tube in this embodiment is typically selected with a wall thickness WS which, in comparison to the diameter D of the core tube, is not selected so as to be too small—for instance, with $WS \geq 0.01*D$ or else $WS \geq 0.02*D$. In the context of the invention, it is also possible in particular to use a core tube made from an Nb—Cu alloy, preferably with a proportion of at least 50 wt % of Nb and a proportion of at least 25 wt % of Cu.

Preferred, furthermore, is an embodiment in which
at least some of the Nb-containing rod elements of the region of mutually abutting Nb-containing rod elements are configured with an Nb-containing core filament which as well as Nb also comprises Ti, Ta, Hf and/or Zr, and/or
interspersed in the region of mutually abutting Nb-containing rod elements are extra rod elements which comprise Ti, Ta, Hf and/or Zr. By alloying Ta, Ti, Hf and/or Zr in the $Nb_3Sn$ resulting from the reactive heat treatment, it is possible to increase the current carrying capacity of the completed superconductor wire (formation of a ternary phase). The use of "doping rods" enables the targeted introduction of the elements Ta, Ti, Hf and/or Zr particularly close to the locations at which the $Nb_3Sn$ is also formed. If Nb-containing rod elements are used that have a core filament alloyed with Ti/Ta/Hf/Zr, typically only a few Nb-containing rod elements of the subelement are configured with an Nb-containing core filament of this kind alloyed with Ti/Ta/Hf/Zr. Alternatively, however, all of the Nb-containing rod elements can also be configured with an Nb-containing core filament alloyed with Ti/Ta/Hf/Zr. If extra rod elements are interspersed, they usually contain no Nb (though it is also possible to configure the extra rod elements with an Nb fraction). The extra rod elements may be homogeneous in composition (thus having no core filament and no filament casing) or are surrounded by a Cu or Cu-containing sheath.

Preferred, furthermore, is an embodiment wherein the Sn-containing powder is a powder mixture which comprises a powder fraction which is Ta-containing and/or Ti-containing and/or Hf-containing and/or Zr-containing. By alloying Ta, Ti, Hf and/or Zr in the $Nb_3Sn$ which forms as a result of the reactive heat treatment, it is possible to increase the current carrying capacity of the completed superconductor wire (ternary phase). Introducing Ta, Ti, Hf and/or Zr as a powder fraction in the Sn-containing powder of the core is particularly simple. In particular there is no need for "doping rods" which (after delivery of Ta/Ti/Hf/Zr) are themselves no longer able to form $Nb_3Sn$. By this route, furthermore, the diffusion of Sn during the reactive heat treatment can be increased, with beneficial consequences for the superconducting properties.

In one advantageous embodiment it is provided
that the region of mutually abutting Nb-containing rod elements also comprises at least one alloy component X, that the Sn-containing powder also comprises at least one partner component Pk,
more particularly where the Sn-containing powder is a powder mixture which comprises a powder fraction which comprises the partner component Pk,
and that the alloy component X and the partner component Pk are selected and arranged in such a way that on reactive heat treatment of the subelement, wherein Sn from the Sn-containing core and Nb from the Nb-containing rod elements react to give $Nb_3Sn$, precipitates XPk can form. Through the formation of the precipitates XPk it is possible to create pinning centers with which the current carrying capacity (critical current density) of the superconducting phase can be increased. XPk here represents all stoichiometric proportions of X and Pk in the precipitates. A typical reactive heat treatment for the formation of $Nb_3Sn$ includes a temperature increase, possibly with interim plateaus, to a maximum temperature of 600° C.-800° C.

Preference is given to a development of this embodiment wherein the at least one partner component Pk comprises oxygen. The provision of oxygen in the core and the formation of oxidic precipitates in the $Nb_3Sn$ microstructure are particularly simple to accomplish. In particular, the alloy component X and the partner component Pk in the Sn-containing core and/or powder core can in general be provided without adverse effect on the reshape properties of the subelement. Alternatively or additionally to oxygen (O), the partner component Pk used can also be sulfur (for forming ZnS, for instance), silicon (for forming $Ca_2Si$, for instance), carbon (for forming $Fe_3C$, for instance) or a halogen such as chlorine or fluorine (for forming $CaF_2$, for instance), with which nonoxidic precipitates can be formed.

In this development it is preferable that the Sn-containing powder comprises a Pk-containing powder fraction, where the Pk-containing powder fraction comprises a metal oxide which can be reduced by the alloy component X, more particularly where the metal of the metal oxide comprises Sn, Cu, Zn, Nb, Fe, Ni, Cr, Co and/or W and/or the metal oxide comprises $SnO_2$, $Cu_2O$, CuO, ZnO, $Ag_2O$ and/or $Nb_2O_5$. These materials systems show a good improvement in the superconducting current carrying capacity, and are easy to use and cost-effective. The metal oxide typically has a lower oxidation potential than $NbO_2$.

In one preferred development, the alloy component X comprises a metal which is less noble than Nb, more particularly where the alloy component X here comprises Zr, Al, Ti, Hf and/or Be. These alloy components are easy to handle, and form effective precipitates for improving the current carrying capacity of the superconductor wire.

In a further, preferred embodiment, the alloy component X in the Nb-containing core filaments is present at least in some of the Nb-containing rod elements. This is simple to set up and allows the precipitates to form at the desired location in the $Nb_3Sn$ microstructure.

Advantage is achieved, furthermore, by an embodiment of the subelement of the invention wherein the subelement further comprises
  a diffusion barrier which surrounds the outer matrix, more particularly where the diffusion barrier comprises at least one of the elements Nb, Ta and/or V, and
  a casing structure which comprises Cu and which surrounds the diffusion barrier, more particularly where the casing structure has a hexagonal external cross section. The diffusion barrier hinders or prevents radially outward diffusion of Sn into the casing structure. This ensures that the casing structure retains a high (normally conducting) electrical conductivity after the reactive heat treatment, thereby stabilizing and protecting the superconductor wire in operation. The diffusion barrier is configured preferably with at least 50 wt % of Nb, Ta and/or V. The casing structure preferably has the hexagonal external cross section before the (fully assembled) subelement is first subjected to reshaping with a reduction in cross section.

Also embraced by the present invention is a method for producing a subelement for an $Nb_3Sn$-containing superconductor wire, more particularly a subelement of the invention as described above,
where the subelement is configured with
  an Sn-containing core,
  an inner matrix which comprises Cu and which surrounds the Sn-containing core,
  a region of mutually abutting Nb-containing rod elements, which surrounds the inner matrix, where the Nb-containing rod elements are each configured with an Nb-containing core filament and a Cu-containing filament casing,
more particularly where the Nb-containing rod elements are each configured hexagonally in external cross section,
  an outer matrix which comprises Cu and surrounds the region of Nb-containing rod elements, characterized
in that the Sn-containing core is fabricated separately, with the steps of
  a) introducing an Sn-containing powder into a core tube,
  b) reshaping the core tube including the Sn-containing powder with a reduction in cross section, where the Sn-containing powder of the Sn-containing core is compacted,
and in that the separately fabricated Sn-containing core is inserted into a recess in the inner matrix of the subelement. In this way it is possible, in a simple and cost-effective way, to produce subelements which exhibit a high superconducting current carrying capacity in the completed superconductor wire. A diffusion barrier may be or may have been arranged around the outer matrix.

One preferred variant of the method of the invention provides
that a main body of the subelement, which comprises the inner matrix with the recess, the region of mutually abutting Nb-containing rod elements and the outer matrix, is fabricated separately, with the steps of
  a') arranging the Nb-containing rod elements around a one-part or multipart inner structure which comprises Cu, and arranging at least one outer structure which comprises Cu around the Nb-containing rod elements, to give an intermediate body,
  b') subjecting the intermediate body to reshaping with a reduction in cross section, and
  c') incorporating a recess into the inner structure with reduced cross section, to give the inner matrix with the recess and overall the main body. With this approach, it becomes possible, in a simple and cost-effective way, to carry out separate fabrication of a main body, into which the likewise separately fabricated Sn-containing core can then be inserted. The substeps of step a') may be place in any order. The (continuous) recess in the inner structure is made typically by drilling. Further to the outer structure (for instance, outer tube) comprising Cu, a barrier tube can be inserted between the outer structure and the Nb-containing rod elements. Alternatively to a barrier tube, it is also possible to use a barrier plate wound to form a tube. The inner structure may be configured at its most simple in the form of a one-piece rod. Alternatively, the inner structure may also be assembled from component elements, more particularly from a bundle of hexagonal component elements or a bundle of sector-shaped component elements. If desired, the main body may be fabricated with a diffusion barrier and with a casing structure surrounding said barrier. For this purpose, for example, the intermediate body may be fabricated within step a') with an (as yet undeformed) preliminary diffusion barrier tube and with an (as yet undeformed) preliminary casing structure tube. Alternatively, the diffusion barrier and the casing structure can also be mounted onto the intermediate body of reduced cross section after step b'), for example.

Likewise embraced by the present invention is a method for producing an $Nb_3Sn$-containing superconductor wire, comprising the following steps:
  fabricating a plurality of subelements according to a method of the invention as described above;
  subjecting the fabricated subelements to reshaping with reduction in cross section;
  bundling the reshaped subelements to form a fabricated conductor arrangement, where a plurality of reshaped subelements are placed against one another and enclosed by a Cu-containing outer wire structure;
  subjecting the fabricated conductor arrangement to reshaping with reduction in cross section;
  bringing the reshaped fabricated conductor arrangement into a desired geometric form, more particularly by winding to form a coil;
  subjecting the fabricated conductor arrangement, brought into form, to reactive heat treatment, wherein the Nb and the Sn from the subelements react to give $Nb_3Sn$. With this method, an $Nb_3Sn$-containing superconductor wire with high current carrying capacity can be obtained in a simple and cost-effective way.

Further advantages of the invention are apparent from the description and the drawing. Similarly, the features identified above and those set out further below may in accordance with the invention be used each individually on their own or as a plurality of features in any desired combinations. The embodiments shown and described should not be understood as a conclusive listing, instead having more of an illustrative character for the outlining of the invention.

DETAILED DESCRIPTION

Figure 1:
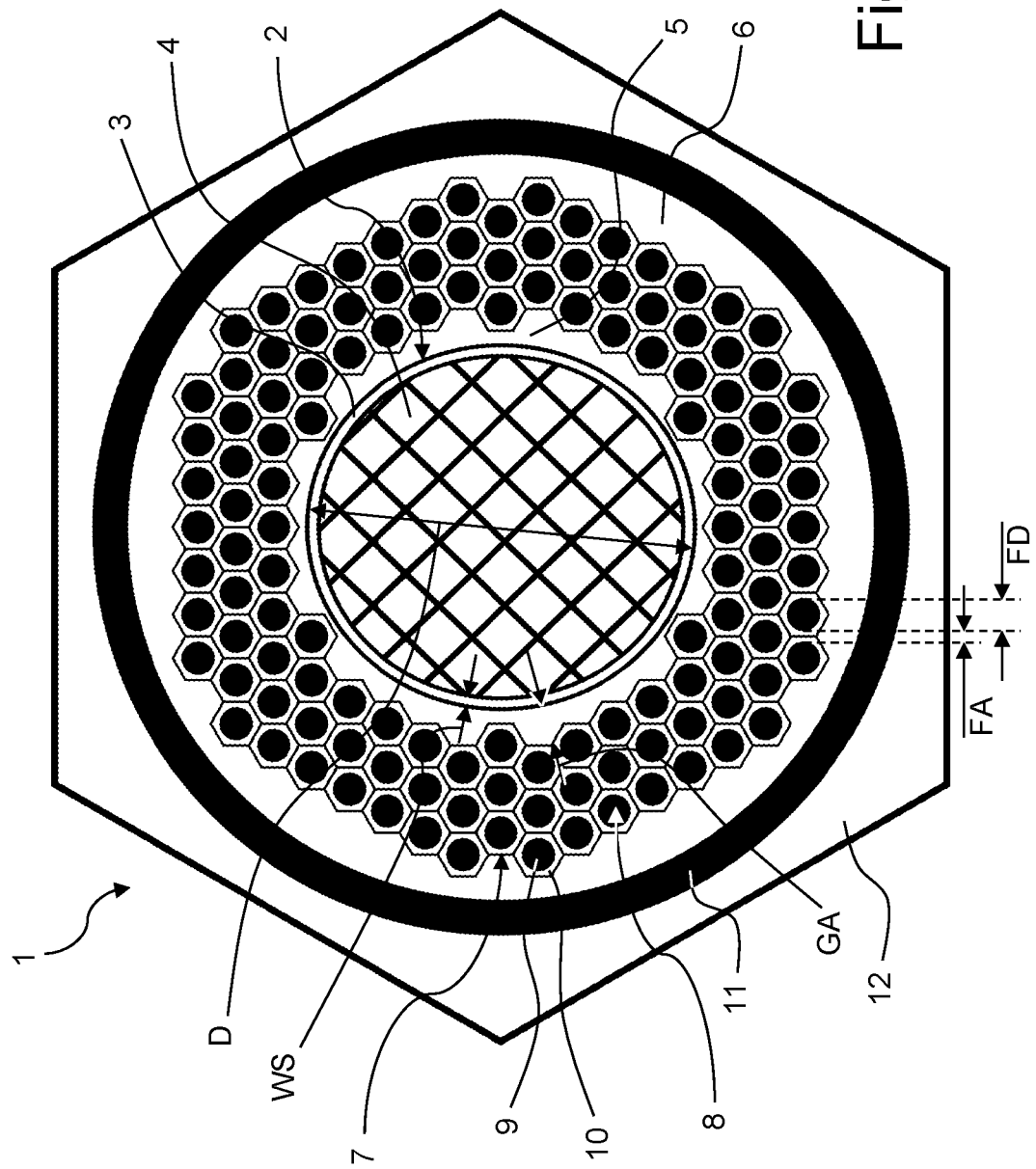
FIG. 1 shows in a schematic cross section a first embodiment of a subelement of the invention.

FIG. 1 shows in a schematic cross section a first embodiment of a subelement 1 of the invention (also called preliminary conductor) which can be used for producing an $Nb_3Sn$-containing superconductor wire.

The subelement 1 comprises an Sn-containing core 2, which is configured by a core tube 3, fabricated here from an alloy containing around 53 wt % of Nb and around 47 wt % of Ti, and also by an Sn-containing powder 4 which has been introduced into the core tube 3 ("powder core"). In an alternative embodiment the core tube 3 may also be manufactured from elemental Cu.

The Sn-containing powder 4 here is a powder mixture of elemental Sn powder, elemental Cu powder, $NbSn_2$ powder, $SnTi_2$ powder, and CuO powder. The total content of Sn (from the elemental Sn powder, the $NbSn_2$ powder and the $SnTi_2$ powder) in the powder mixture here is around 60 wt %.

The wall thickness WS of the core tube 3 is small in relation to the diameter D of the core tube 3, here with around WS=0.03*D; generally preferred is WS≤0.15*D or else WS≤0.10*D or even WS≤0.5*D.

Figure 4:
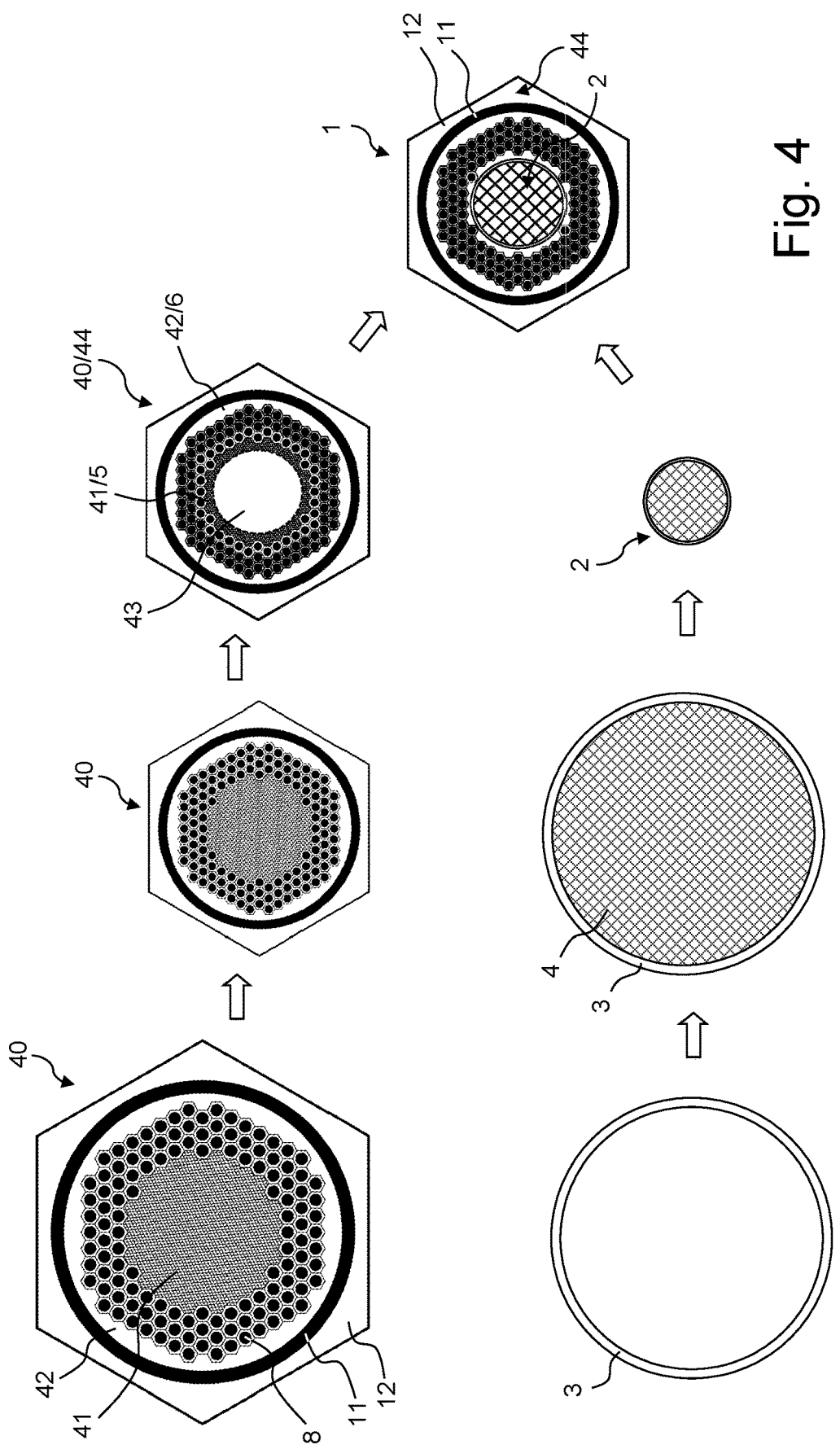
FIG. 4 illustrates schematically a variant of a method of the invention for producing a subelement of the invention.

The Sn-containing powder 4 is in a compacted state in the core tube 3, resulting here from a preceding reshaping, with reduction in cross section, of the filled core tube 3 (in this regard, cf. FIG. 4). The Sn-containing powder here has been compacted to around 50% of its theoretical density, and therefore still includes a proportion of voids ("pores").

The Sn-containing core 2 is surrounded by an inner matrix 5, fabricated here from elemental Cu. Between the inner matrix 5 and an outer matrix 6, which here likewise consists of elemental Cu, there is an annular region 7 of mutually abutting Nb-containing rod elements 8. Each of the Nb-containing rod elements 8 comprises an Nb-containing core filament 9 and a Cu-containing filament casing 10, which surrounds the Nb-containing core filament 9.

The Nb-containing core filaments 9 consist here of an alloy of Nb and Hf. This alloy consists very predominantly of Nb; the proportion of Hf here is 1 wt % of less. The Cu-containing filament casings 10 here consist of elemental Cu; alternatively, a certain proportion of Sn may also be provided in the Cu-containing filament casings 10. The Nb-containing rod elements 8 here have a hexagonal external cross section.

The largest radial distance GA between the outside of the core tube 3 and the inside of the region 7 of the Nb-containing rod elements 8, in other words the largest radial wall thickness of the inner matrix 5, is likewise small in relation to the diameter D of the core tube 3, here with around GA=0.10*D; generally preferred is GA≤0.30*D or else GA≤0.20*D.

Furthermore, in the cross section shown, the smallest distance FA between the Nb-containing core filaments 9 is small in relation to the diameter FD of the Nb-containing core filaments 9, here with around FA=0.30*FD; generally preferred is FA≤0.30*FD or else FA≤0.20*FD or else FA≤0.15*FD or even FA≤0.10*FD.

Arranged around the outer matrix 6 in the embodiment shown is a tubular diffusion barrier 11, fabricated here from elemental Nb. The diffusion barrier 11 is surrounded in turn by a casing structure 12, which here is fabricated from elemental Cu and has a hexagonal external cross section.

The subelement 1 may be used to fabricate an $Nb_3Sn$-containing superconductor wire, in which case typically a plurality of subelements 1 are drawn, bundled and brought into a desired geometry (in this regard, cf. FIG. 5), and lastly are subjected to a reactive heat treatment. During this treatment, the Sn from the Sn-containing core 3 reacts in particular with the Nb from the region 7 of the Nb-containing rod elements 8, and $Nb_3Sn$ is formed.

In the embodiment shown, the Cu present in the Sn-containing powder 4 accelerates the radially outward diffusion of the Sn. The Ti from the $SnTi_2$, and also, to a small extent here, from the core tube 3 of the Sn-containing core 2, provides for the formation of a ternary phase (containing Nb, Sn and Ti), and this increases the superconducting current carrying capacity of the completed $Nb_3Sn$-containing superconductor wire. Moreover, the Ti may also contribute to accelerating the radially outward diffusion of the Sn. Furthermore, the Hf (as alloy component X) in the Nb-containing core filaments 9 reacts with the oxygen (as partner component Pk) from the CuO in the Sn-containing powder 4 to give Hf oxide particles (as precipitates XPk), which as pinning centers may increase the current carrying capacity of the $Nb_3Sn$ phase.

Formed on the core tube 3, fabricated here with a high Nb content, in the course of the reactive heat treatment is a layer of $NbSn_2$ which, in a first phase of the reactive heat treatment, retards the further radially outward diffusion of Sn. In a second phase of the reactive heat treatment, at higher temperatures, the $NbSn_2$ breaks down into Sn and $Nb_3Sn$, and so Sn is released radially close to the region 7 of the Nb-containing rod elements 8. Accordingly, in the former region 7 of the Nb-containing rod elements 8, a very fine microstructure of $Nb_3Sn$ can be obtained at the end of the reactive heat treatment, and possesses a large superconducting current carrying capacity. In the region of the former core tube 3 and/or its former area as well, moreover, $Nb_3Sn$ may be obtained.

Figure 2:
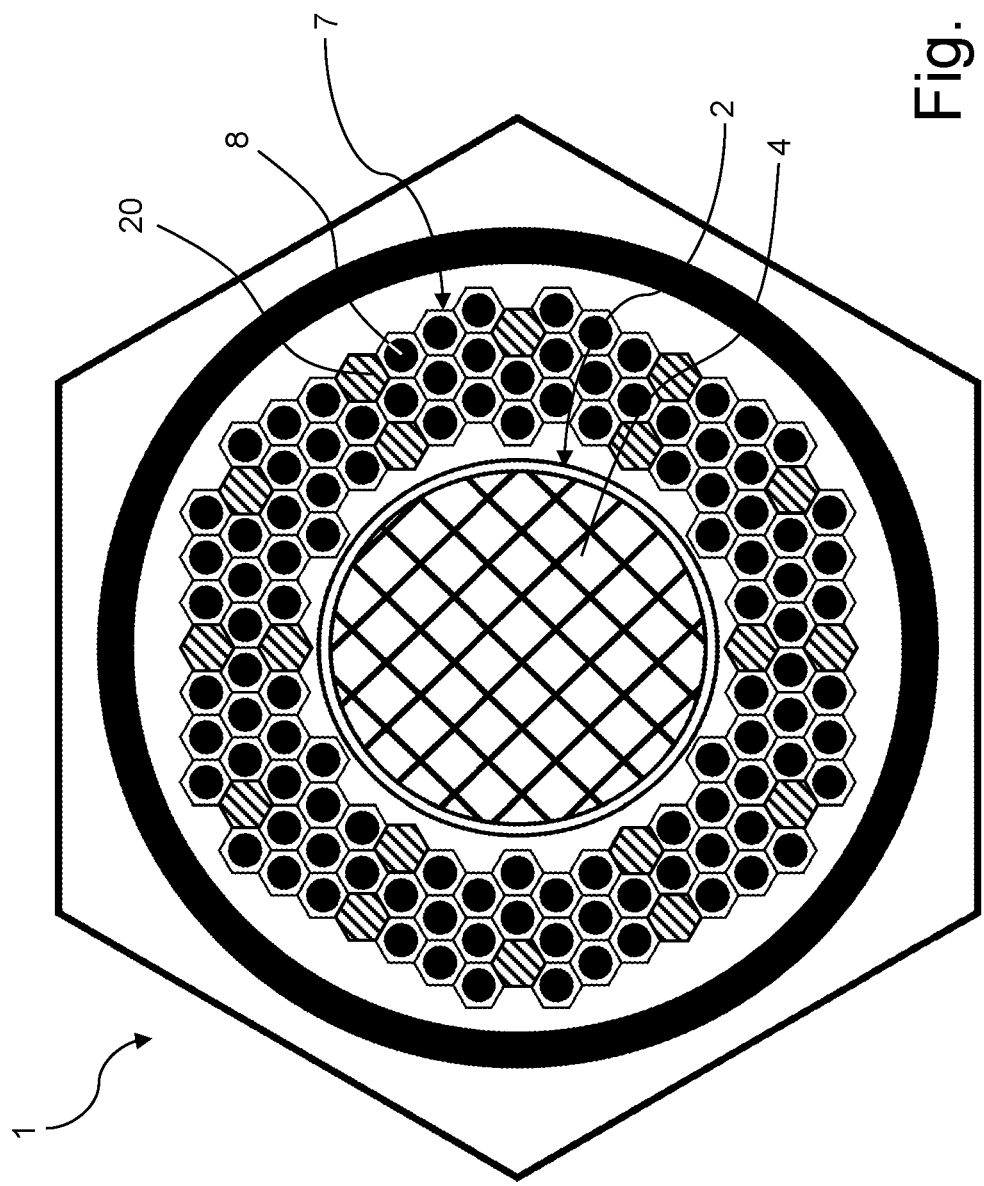
FIG. 2 shows in a schematic cross section a second embodiment of a subelement of the invention, where there are extra rod elements comprising Ta interspersed among the Nb-containing rod elements.

FIG. 2 shows a second embodiment of a subelement 1 of the invention, similar to the first embodiment. Accordingly, only the substantial differences between these embodiments are explained below.

Here, in the region 7 of the Nb-containing rod elements 8, extra rod elements 20 are interspersed among the Nb-containing rod elements 8 (shown with hatching). The extra rod elements 20 likewise have a hexagonal contour and have the same size as the Nb-containing rod elements 8. The extra rod elements 20 here contain Nb and Ti, and consist here, correspondingly, of an alloy of Nb and Ti. In addition, Hf (as alloy component X) may also be included. The extra rod elements 20 possess a homogenous (unstructured) composition. This Ti enables the formation, in turn, of a ternary phase (of Nb, Sn and Ti), thereby improving the current carrying capacity of the completed $Nb_3Sn$ superconductor wire. In this case it is not necessary to provide the powder mixture of the Sn-containing powder 4 of the Sn-containing core 2 with $SnTi_2$.

Figure 3:
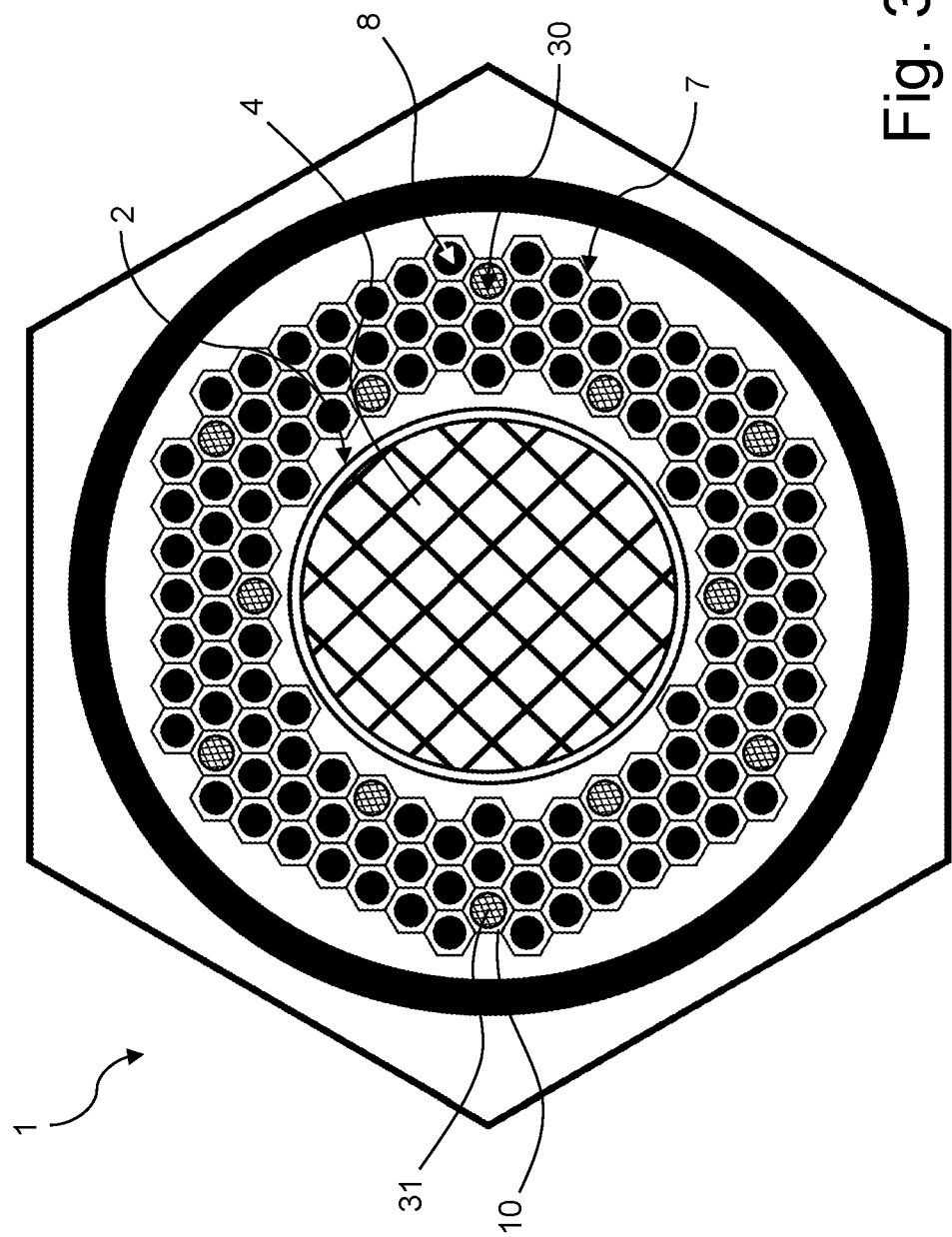
FIG. 3 shows in a schematic cross section a third embodiment of a subelement of the invention, where some of the Nb-containing rod elements are configured with an Nb-containing core filament which additionally comprises Ta.

FIG. 3 shows a third embodiment of a subelement 1 of the invention, similar to the first embodiment. Again, only the substantial differences between these embodiments are detailed below.

In the region 7 of the Nb-containing rod elements 8, 30 there are, here, a number of Nb-containing rod elements 30 configured with a Nb-containing core filament 31, which as well as Nb contains Ti. Correspondingly, the Nb-containing core filaments are fabricated from an alloy of Nb and Ti. In addition, there may also be Hf (i.e., alloy component X) included. This Ti enables again the formation of a ternary phase (of Nb, Sn and Ti), thereby improving the current carrying capacity of the completed $Nb_3Sn$ superconductor wire. In this case as well, there is no need to provide the powder mixture of the Sn-containing powder 4 of the Sn-containing core 2 with $SnTi_2$.

FIG. 4 depicts, in schematic serial diagrams, an illustrative variant of the production of a subelement 1 of the invention.

For the fabrication of the subelement 1, an intermediate body 40 is provided first in a separate fabricating operation. This body comprises a Cu-containing inner structure 41, which here is in one piece and is fabricated here from elemental Cu. The inner structure 41 may have an externally round or profiled (as shown) configuration. The inner structure 41 is surrounded by a ring of Nb-containing rod elements 8. Disposed around the Nb-containing rod elements 8 is a Cu-containing outer structure 42, fabricated here from elemental Cu. The outer structure 42 may have an internally round or profiled (as shown) configuration.

In the embodiment shown, the intermediate body 40 also comprises a diffusion barrier 11, here made of elemental Nb, which is arranged around the outer structure 42, and also comprises a casing structure 12, made here from elemental Cu, which is disposed around the diffusion barrier 11 and here has a hexagonal outer form.

The intermediate body 40 is then subjected to reshaping with reduction in cross section—to extruding, for instance. Subsequently a recess (passage) 43, presently a drilled hole, is made in the inner structure 42 (of reduced cross section). The intermediate body 40 reduced in cross section and drilled in this way is also referred to as main body 44 of the subelement 1. The former inner structure 41 then corresponds to the inner matrix 5, and the former outer structure 42 then corresponds to the outer matrix 6.

Furthermore, in a separate fabricating operation, an Sn-containing powder 4 is introduced into a core tube 3, made here from an alloy of Nb and Ti. The core tube 3 thus filled is then subjected to reshaping with a reduction in cross section—through extruding, for instance. In the course of this procedure, the Sn-containing powder 4 is compacted, specifically being compressed substantially radially. This gives the Sn-containing core 2 for the subelement 1.

The separately fabricated Sn-containing core 2 is then inserted into the recess 43 in the separately fabricated main body 44, to give the complete subelement 1.

It is noted that the diffusion barrier 11 and the casing structure 12 may also, alternatively, be arranged on the subelement 1 after the joining-together of main body 44 and Sn-containing core 2 (not shown in more detail).

Figure 5:
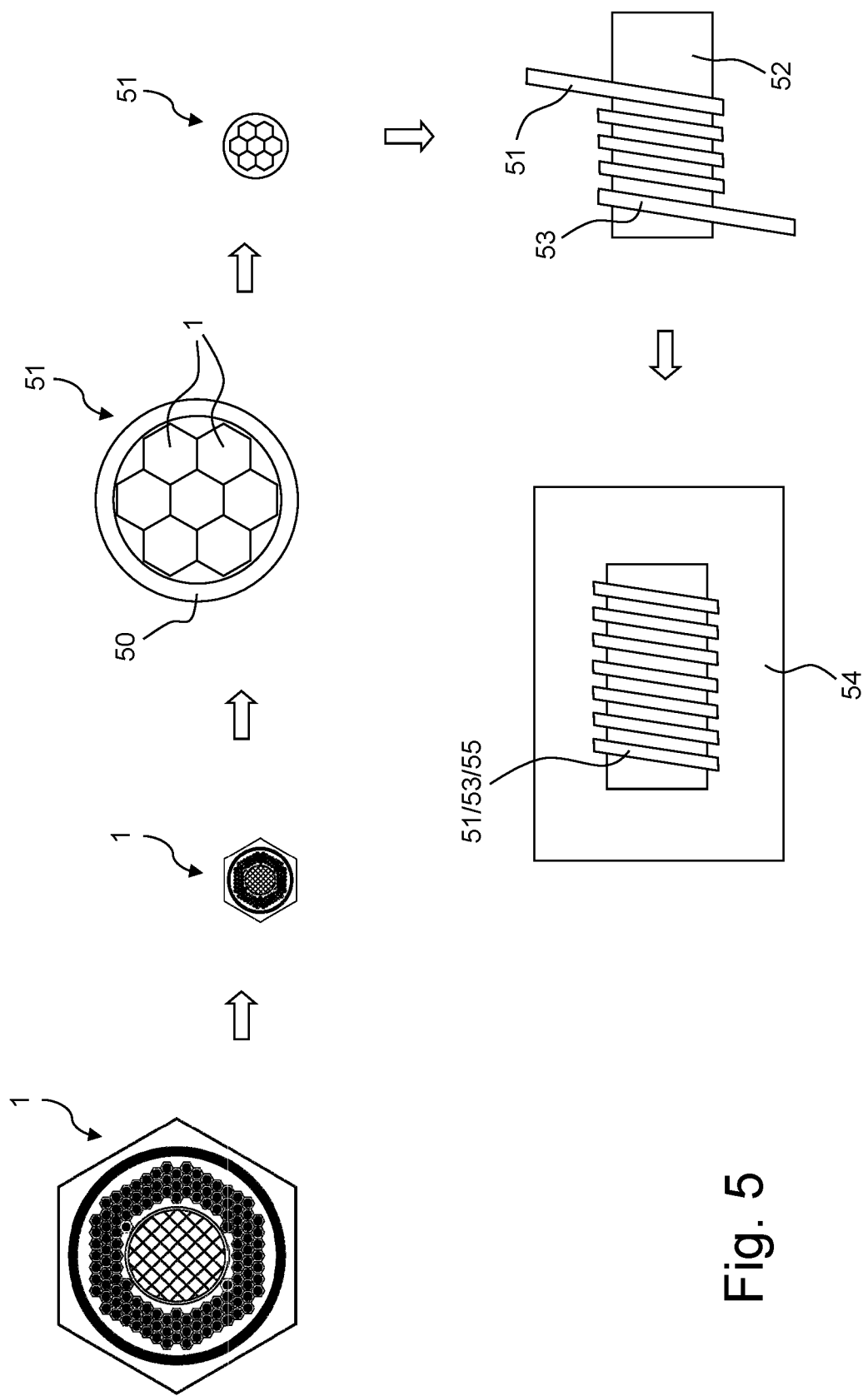
FIG. 5 illustrates schematically a variant of a method of the invention for producing an $Nb_3Sn$-containing superconductor wire.

FIG. 5 then depicts, in schematic serial diagrams, an illustrative variant of the production of an $Nb_3Sn$-containing superconductor wire 55 in accordance with the invention, based on subelements 1 of the invention.

A subelement 1 (also referred to as preliminary conductor) produced as shown in FIG. 4, for example, is first subjected to reshaping with a reduction in cross section—to extruding, for instance. Then a plurality of subelements 1 of reduced cross section are bundled in an outer wire structure 50, to give a fabricated conductor arrangement 51. The bundling is easy to accomplish by virtue of the hexagonal outer form of the subelements 1. The outer wire structure 50 may have an internally round (as shown) or profiled configuration. Here, outwardly, the outer wire structure 50 has a round configuration; also possible, however, are other outer forms, for instance a rectangular outer form. The fabricated conductor arrangement 51 is subsequently subjected to reshaping with reduction in cross section—to extruding, for instance.

The reshaped fabricated conductor arrangement 51 is then brought into a desired geometric form, and for that purpose, in the variant shown, illustratively, is wound on a winding body 52 to form a coil 53, in this case a solenoid coil. The wound fabricated conductor arrangement 51 or coil 53 is then conveyed into an oven 54, in which the coil 53 is heated, typically up to a maximum temperature between 600° C. and 800° C. In the course of this reactive heat treatment, the superconducting $Nb_3Sn$ phase is formed in the subelements contained in the fabricated conductor arrangement 51.

The reactive heat treatment turns the fabricated conductor arrangement 51 into the ready-to-use $Nb_3Sn$-containing superconductor wire 55. On sufficient cooling (with liquid helium, for instance), the $Nb_3Sn$ filaments formed in the $Nb_3Sn$-containing superconductor wire 55 adopt a superconducting state, in which they are able to carry electrical current without loss. By virtue of the invention, the $Nb_3Sn$-containing superconductor wire 55 has a particularly high current carrying capacity.

Figure 6:
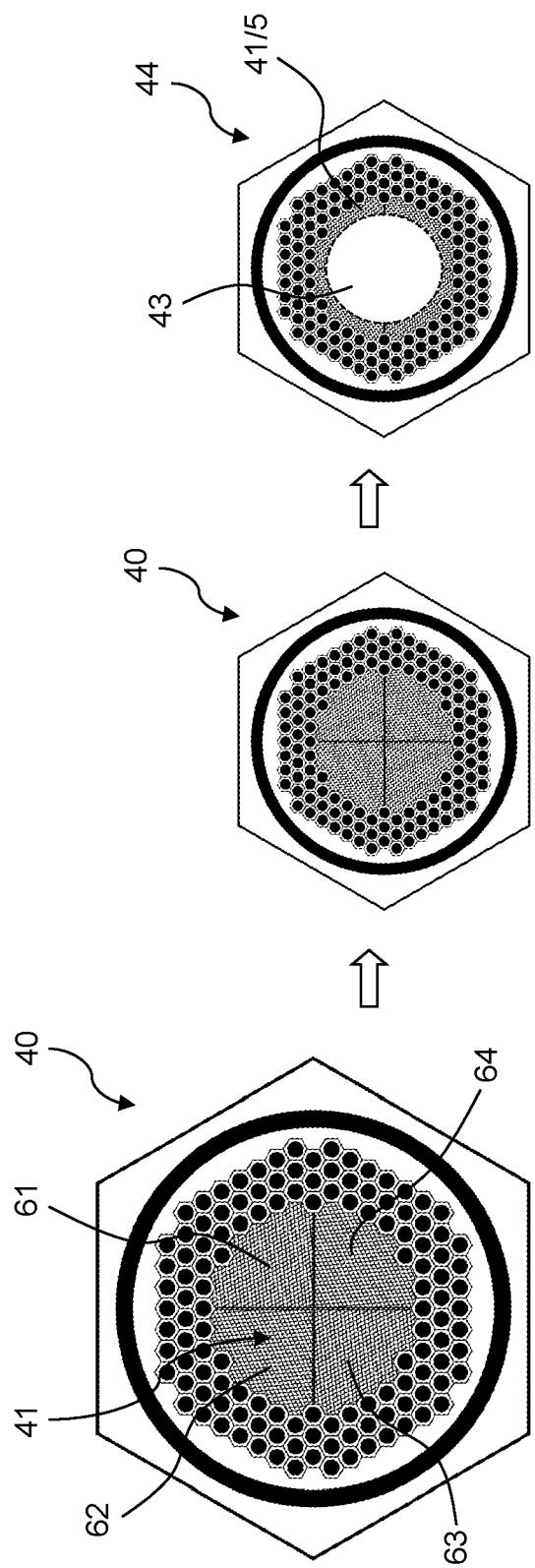
FIG. 6 illustrates schematically a modification of the variant shown in FIG. 4 for producing a subelement of the invention, utilizing a multipart inner structure for the main body.

FIG. 6 depicts, in schematic serial diagrams, a modification of the variant illustrated in FIG. 4 for producing a main body 44 for a subelement of the invention. Only the substantial differences relative to FIG. 4 are described in detail.

In the modification shown in FIG. 6, the outwardly profiled inner structure 41 consists of four individual pieces 61, 62, 63 and 64, which are substantially sector-shaped in configuration and which together form/fill the interior of the intermediate body 40. This makes it easier to fabricate the inner structure 41. It is noted that the individual pieces 61-64 in the modification shown are identical in construction, and are arranged only with different orientation and lying against one another.

After the reshaping of the intermediate body 40 with reduction in cross section, and after the recess 43 has been introduced, a main body 44 is obtained whose inner matrix 5—corresponding to the multipart inner structure 41—is likewise of multipart configuration. However, the parts of the matrix 5 (owing in particular to mutual support) are seated so firmly in the main body 44 that there is no need for any further holding measures, and the main body 44 as shown in FIG. 4 can be handled further. In particular, an Sn-containing core may be inserted into the main body 44 as shown in FIG. 4, in order to produce a subelement according to the invention.

LIST OF REFERENCE SYMBOLS 1 subelement
2 Sn-containing core
3 core tube
4 Sn-containing powder/powder core
5 inner matrix
6 outer matrix
7 region of Nb-containing rod elements
8 Nb-containing rod element
9 Nb-containing core filament
10 Cu-containing filament casing
11 diffusion barrier
12 casing structure
20 extra rod element
30 Nb-containing rod element whose Nb-containing core filament contains an extra constituent/part of the Nb-containing rod elements
31 core filament with extra constituent
40 intermediate body
41 inner structure
42 outer structure
43 recess/passage
44 main body
50 outer wire structure
51 fabricated conductor arrangement
52 coil body
53 coil
54 oven
55 $Nb_3Sn$-containing superconductor wire
61-64 individual pieces of inner structure
D diameter of core tube
FA smallest distance of Nb-containing core filaments
FD diameter of Nb-containing core filaments
GA greatest distance
WS wall thickness of core tube

What is claimed is:

1. A method for producing a subelement for an $Nb_3Sn$-containing superconductor wire,
said subelement comprising
an Sn-containing core,
an inner matrix which comprises Cu and which is configured to surround the Sn-containing core,
a region of mutually abutting Nb-containing rod elements, which surrounds the inner matrix, where the Nb-containing rod elements are each configured with an Nb-containing core filament and a Cu-containing filament casing, and
an outer matrix which comprises Cu and surrounds the region of the Nb-containing rod elements,
said method comprising:
fabricating the Sn-containing core by
a) introducing an Sn-containing powder into a core tube, and
b) reshaping the core tube including the Sn-containing powder with a reduction in cross section, wherein the Sn-containing powder of the Sn-containing core is compacted, and inserting the fabricated Sn-containing core into a recess in the inner matrix of the subelement.

2. The method as claimed in claim 1, wherein, in the subelement, a wall thickness WS of the core tube and a diameter D of the core tube are subject to the following condition:

$WS \leq 0.15 * D$.

3. The method as claimed in claim 2, wherein the wall thickness WS of the core tube and the diameter D of the core tube are subject to the following condition:

$WS \leq 0.10 * D$.

4. The method as claimed in claim 1, wherein the region of the mutually abutting Nb-containing rod elements also comprises at least one alloy component X, wherein the Sn-containing powder also comprises at least one partner component Pk, and wherein the alloy component X and the partner component Pk are selected and arranged such that on reactive heat treatment of the subelement, wherein Sn from the Sn-containing core and Nb from the Nb-containing rod elements react to form $Nb_3Sn$, precipitates XPk form.

5. The method as claimed in claim 4, wherein the at least one partner component Pk comprises oxygen.

6. The method as claimed in claim 5, wherein the Sn-containing powder comprises a Pk-containing powder fraction, where the Pk-containing powder fraction comprises a metal oxide which, on the reactive heat treatment of the subelement, is reduced by the alloy component X.

7. The method as claimed in claim 4, wherein the alloy component X comprises a metal which is less noble than Nb.

8. The method as claimed in claim 4, wherein the alloy component X is present in the Nb-containing core filaments of at least some of the Nb-containing rod elements.

9. The method as claimed in claim 4, wherein the Sn-containing powder is a powder mixture which comprises a powder fraction which comprises the partner component Pk.

10. The method as claimed in claim 1, wherein, in the subelement:

$GA \leq 0.30 * D$, preferably $GA \leq 0.20 * D$, more preferably $GA \leq 0.10 * D$ where: GA is a largest radial distance between the core tube and the inside of the region of the Nb-containing rod elements of the inner matrix, and
D is a diameter of the core tube.

11. The method as claimed in claim 10, wherein, in the subelement:

$GA \leq 0.10 * D$.

12. The method as claimed in claim 1, wherein, in the subelement:

$FA \leq 0.15 * FD$.

13. The method as claimed in claim 1, wherein the Sn-containing powder is a powder mixture which comprises Sn in at least two different chemical forms.

14. The method as claimed in claim 1, wherein the Sn-containing powder is a powder mixture which comprises a Cu-containing powder fraction.

15. The method as claimed in claim 1, wherein the core tube is Cu-containing.

16. The method as claimed in claim 1, wherein the core tube is Nb-containing.

17. The method as claimed in claim 1, wherein
at least some of the Nb-containing rod elements of the region of the mutually abutting Nb-containing rod elements are configured with an Nb-containing core filament which, as well as Nb, also comprises Ti, Ta, Hf and/or Zr, and/or extra rod elements which comprise Ti, Ta, Hf and/or Zr are interspersed in the region of the mutually abutting Nb-containing rod elements.

18. The method as claimed in claim 1, wherein the Sn-containing powder is a powder mixture which comprises a powder fraction which is Ta-containing and/or Ti-containing and/or Hf-containing and/or Zr-containing.

19. The method as claimed in claim 1, wherein the subelement further comprises a diffusion barrier which surrounds the outer matrix, and a casing structure which comprises Cu and which surrounds the diffusion barrier.

20. The method as claimed in claim 1, wherein, in the subelement:

$$FA \leq 0.30 * FD,$$

where: FA is a smallest distance from outside to outside between the Nb-containing core filaments, and FD is a diameter of the Nb-containing core filaments.

21. The method as claimed in claim 1, wherein a main body of the subelement, which comprises the inner matrix with a recess, the region of the mutually abutting Nb-containing rod elements and the outer matrix, is fabricated by a') arranging the Nb-containing rod elements around a one-part or multipart inner structure which comprises Cu, and arranging at least one outer structure which comprises Cu around the Nb-containing rod elements, to form an intermediate body, b') subjecting the intermediate body to reshaping with a reduction in cross section, and c') incorporating the recess into the inner structure with reduced cross section, to form the inner matrix with the recess and overall the main body.

22. A method for producing an $Nb_3Sn$-containing superconductor wire, comprising:

fabricating a plurality of subelements as claimed in claim 1;

subjecting the fabricated subelements to reshaping with reduction in cross section;

bundling the reshaped subelements to form a fabricated conductor arrangement, wherein a plurality of the reshaped subelements are placed against one another and enclosed by a Cu-containing outer wire structure;

subjecting the fabricated conductor arrangement to reshaping with reduction in cross section;

bringing the reshaped fabricated conductor arrangement into a predetermined geometric form; and subjecting the fabricated conductor arrangement, brought into form, to reactive heat treatment, wherein the Nb and the Sn from the subelements react to form $Nb_3Sn$.

* * * * *